United States Patent
Smith et al.

(10) Patent No.: US 10,490,413 B2
(45) Date of Patent: *Nov. 26, 2019

(54) SELECTIVE GROWTH OF SILICON NITRIDE

(71) Applicant: Lam Research Corporation, Fremont, CA (US)

(72) Inventors: David Charles Smith, Lake Oswego, OR (US); Dennis M. Hausmann, Lake Oswego, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/878,349

(22) Filed: Jan. 23, 2018

(65) Prior Publication Data

US 2018/0269058 A1   Sep. 20, 2018

Related U.S. Application Data

(63) Continuation of application No. 15/462,695, filed on Mar. 17, 2017, now Pat. No. 9,911,595.

(51) Int. Cl.
*H01L 21/311* (2006.01)
*H01L 21/321* (2006.01)
(Continued)

(52) U.S. Cl.
CPC .... *H01L 21/31138* (2013.01); *H01L 21/0217* (2013.01); *H01L 21/0228* (2013.01);
(Continued)

(58) Field of Classification Search
CPC . H01L 21/31138; H01L 21/321; H01L 21/32; H01L 21/02219; H01L 21/02211;
(Continued)

(56) References Cited

U.S. PATENT DOCUMENTS

| 4,539,061 A | 9/1985 | Sagiv |
| 6,423,582 B1 | 7/2002 | Fischer et al. |

(Continued)

FOREIGN PATENT DOCUMENTS

| JP | 2013-079447 A | 5/2013 |
| KR | 10-2017-0016310 A | 2/2017 |

(Continued)

OTHER PUBLICATIONS

Chabal* et al. (2016) "Atomic Layer Deposition of Silicon Dioxide Using Aminosilanes Di-sec-butylaminosilane and Bis(tert-butylamino)silane with Ozone,". *The Journal of Physical Chemistry C*, ACS Publications, American Chemical Society, 120:10927-10935.

(Continued)

*Primary Examiner* — Sonya D. McCall-Shepard
(74) *Attorney, Agent, or Firm* — Weaver Austin Villeneuve & Sampson LLP

(57) ABSTRACT

Methods and apparatuses for selectively depositing silicon nitride on silicon surfaces relative to silicon oxide surfaces and selectively depositing silicon nitride on silicon oxide surfaces relative to silicon surfaces are provided herein. Methods involve blocking one surface while leaving another surface unblocked and selectively depositing silicon nitride on the unblocked surface. The blocked surface may include an organic moiety having an Si—C bond. The method may include blocking one of an exposed hydroxyl-terminated silicon-containing surface and an exposed hydrogen-terminated silicon-containing surface of the substrate. Apparatuses include a process chamber having a pedestal, an outlet, and a controller for providing instructions for causing delivery of a semiconductor substrate to the pedestal, causing introduction of a silicon-containing precursor and causing (Continued)

introduction of a nitrogen-containing reactant without igniting a plasma.

19 Claims, 7 Drawing Sheets

(51) Int. Cl.
  *H01L 21/32* (2006.01)
  *H01L 21/02* (2006.01)
  *H01L 21/3105* (2006.01)

(52) U.S. Cl.
  CPC .. *H01L 21/02211* (2013.01); *H01L 21/02219* (2013.01); *H01L 21/3105* (2013.01); *H01L 21/32* (2013.01); *H01L 21/321* (2013.01)

(58) Field of Classification Search
  CPC ............. H01L 21/3105; H01L 21/0217; H01L 21/0228
  See application file for complete search history.

(56) References Cited

U.S. PATENT DOCUMENTS

| | | | |
|---|---|---|---|
| 6,593,000 | B2 | 7/2003 | Ohtake et al. |
| 7,728,436 | B2 | 6/2010 | Whelan et al. |
| 7,875,312 | B2 | 1/2011 | Thridandam et al. |
| 8,043,907 | B2 | 10/2011 | Ma et al. |
| 8,530,361 | B2 | 9/2013 | Xiao et al. |
| 8,592,005 | B2 | 11/2013 | Ueda |
| 8,668,957 | B2 | 3/2014 | Dussarrat et al. |
| 8,821,986 | B2 | 9/2014 | Weidman et al. |
| 8,853,075 | B2 | 10/2014 | Gatineau et al. |
| 8,940,648 | B2 | 1/2015 | Xiao et al. |
| 8,945,305 | B2 | 2/2015 | Marsh |
| 9,219,007 | B2 | 12/2015 | Chen et al. |
| 9,257,334 | B2 | 2/2016 | Chen et al. |
| 9,331,094 | B2 | 5/2016 | Hada |
| 9,371,338 | B2 | 6/2016 | Dussarrat et al. |
| 9,911,595 | B1 | 3/2018 | Smith et al. |
| 10,043,656 | B1 | 8/2018 | Smith et al. |
| 10,176,984 | B2 | 1/2019 | Smith et al. |
| 10,199,212 | B2 | 2/2019 | Smith et al. |
| 10,242,866 | B2 | 3/2019 | Smith et al. |
| 2005/0017319 | A1 | 1/2005 | Manabe et al. |
| 2005/0091931 | A1 | 5/2005 | Gracias |
| 2005/0208778 | A1 | 9/2005 | Li et al. |
| 2006/0128142 | A1 | 6/2006 | Whelan et al. |
| 2008/0032064 | A1 | 2/2008 | Gordon et al. |
| 2008/0242097 | A1 | 10/2008 | Boescke et al. |
| 2011/0178092 | A1 | 7/2011 | Ali et al. |
| 2011/0256721 | A1 | 10/2011 | Gatineau |
| 2012/0205315 | A1 | 8/2012 | Liu et al. |
| 2012/0315740 | A1 | 12/2012 | Yao |
| 2014/0113457 | A1 | 4/2014 | Sims et al. |
| 2014/0252486 | A1 | 9/2014 | Lin et al. |
| 2014/0363969 | A1 | 12/2014 | Chen et al. |
| 2015/0111374 | A1 | 4/2015 | Bao et al. |
| 2015/0147871 | A1 | 5/2015 | Xiao et al. |
| 2015/0155523 | A1 | 6/2015 | Kamiya |
| 2015/0235835 | A1 | 8/2015 | Swaminathan et al. |
| 2015/0299848 | A1 | 10/2015 | Haukka et al. |
| 2015/0340225 | A1 | 11/2015 | Kim et al. |
| 2015/0364372 | A1 | 12/2015 | Chen et al. |
| 2015/0371896 | A1 | 12/2015 | Chen et al. |
| 2016/0024647 | A1 | 1/2016 | Saly et al. |
| 2016/0056074 | A1 | 2/2016 | Na et al. |
| 2016/0079521 | A1 | 3/2016 | Draeger et al. |
| 2016/0126106 | A1 | 5/2016 | Shimizu et al. |
| 2016/0280724 | A1 | 9/2016 | Arkles et al. |
| 2016/0322213 | A1 | 11/2016 | Thompson et al. |
| 2016/0376152 | A1 | 12/2016 | Toutonghi |
| 2017/0029947 | A1 | 2/2017 | Kawahara et al. |
| 2017/0029948 | A1 | 2/2017 | Jongbloed et al. |
| 2017/0148642 | A1 | 5/2017 | Wang et al. |
| 2018/0233349 | A1 | 8/2018 | Smith et al. |
| 2018/0261447 | A1 | 9/2018 | Smith et al. |
| 2018/0261448 | A1 | 9/2018 | Smith et al. |
| 2018/0308680 | A1 | 10/2018 | Reddy et al. |
| 2019/0115207 | A1 | 4/2019 | Smith et al. |
| 2019/0148128 | A1 | 5/2019 | Smith et al. |

FOREIGN PATENT DOCUMENTS

| | | |
|---|---|---|
| WO | WO 2014/209327 | 12/2014 |
| WO | WO 2016/048336 | 3/2016 |
| WO | WO 2016/138284 | 9/2016 |
| WO | WO 2016/209570 | 12/2016 |

OTHER PUBLICATIONS

Chen, Rong and Bent*, Stacey F. (2006) "Chemistry for Positive Pattern Transfer Using Area-Selective Atomic Layer Deposition," *Adv. Mater.*, 18:1086-1090.

Chen et al. (2011) "Ozone-Based Atomic Layer Deposition of Crystalline $V_2O_5$ Films for High Performance Electrochemical Energy Storage," *Chemistry of Materials*, ACS Publications, American Chemical Society, 7pp.

Dangerfield et al. (2016) "Role of Trimethylaluminum (TMA) for Low Temperature SiN, Deposition: Growth Dependence on Number of TMA Exposures," *ALD Conference 2016*, 14pp.

Han et al. (2012) "On the Mechanisms of $SiO_2$ Thin-Film Growth by the Full Atomic Layer Deposition Process Using Bis(t-butylamino)silane on the Hydroxylated SiO2(001) Surface," *The Journal of Physical Chemistry C*, ACS Publications, American Chemical Society, 116:947-952.

Huang et al. (2017) "Design of efficient mono-aminosilane precursors for atomic layer deposition of $SiO_2$ thin films," *Royal Society of Chemistry Adv.* 2017, 7:22672-22678.

Li et al. (2014) "Low Temperature (LT) Thermal ALD Silicon Dioxide Using Ozone Process," *Arradiance Inc.*, Sudbury, MA USA, 1 page.

Liu et al. (Jun. 26-29, 2011) "High Rate Growth of $SiO_2$ by Thermal ALD Using Tris(di-methylamino)silane and Ozone," *ALD 2011*, Cambridge NanoTech Inc., Cambridge, MA, USA, 14pp.

Ooba et al. (1998) "Self-Limiting Atomic-layer Selective Deposition of Silicon Nitride by Temperature-Controlled Method," *Extended Abstracts of the 1998 International Conference on Solid State Devices and Materials*, Hiroshima, pp. 22-23.

Putkonen et al. (2014) "Thermal and plasma enhanced atomic layer deposition of $SiO_2$ using commercial silicon precursors," *Thin Solid Films*, 558:93-98.

Sundstrom, (Dec. 2005) "Ozone as the Oxidizing Precursor in Atomic Layer Deposition," *Gas & Chemicals, MKS Instruments, Inc.*, Wilmington, MA, 4pp.

Yokoyama et al. (1998) "Atomic-layer selective deposition of silicon nitride on hydrogen-terminated Si surfaces," *Applied Surface Science*, 130-132, 352-356.

U.S. Appl. No. 15/432,634, filed Feb. 14, 2017, Smith et al.
U.S. Appl. No. 15/453,815, filed Mar. 8, 2017, Smith et al.
U.S. Appl. No. 15/456,301, filed Mar. 10, 2017, Smith et al.
U.S. Appl. No. 15/462,695, filed Mar. 17, 2017, Smith et al.
U.S. Appl. No. 15/581,951, filed Apr. 28, 2017, Reddy et al.
U.S. Appl. No. 15/821,590, filed Nov. 22, 2017, Hausmann et al.
U.S. Office Action, dated Nov. 16, 2017, issued in U.S. Appl. No. 15/432,634.
U.S. Notice of Allowance, dated Oct. 20, 2017, issued in U.S. Appl. No. 15/462,695.
U.S. Notice of Allowance, dated Oct. 23, 2017, issued in U.S. Appl. No. 15/456,301.
U.S. Final Office Action dated May 3, 2018 issued in U.S. Appl. No. 15/432,634.
U.S. Notice of Allowance dated Sep. 6, 2018 issued in U.S. Appl. No. 15/432,634.
U.S. Office Action, dated Feb. 8, 2018, issued in U.S. Appl. No. 15/453,815.
U.S. Notice of Allowance, dated Oct. 5, 2018, issued in U.S. Appl. No. 15/453,815.

(56) References Cited

OTHER PUBLICATIONS

U.S. Notice of Allowance, dated Feb. 13, 2018, issued in U.S. Appl. No. 15/456,301.
U.S. Notice of Allowance, dated Sep. 25, 2018, issued in U.S. Appl. No. 15/975,554.
U.S. Office Action, dated Nov. 1, 2018, issued in U.S. Appl. No. 15/581,951.
International Search Report and Written Opinion dated Jun. 25, 2018 issued in Application No. PCT/US2018/021823.
U.S. Appl. No. 16/206,915, filed Nov. 30, 2018, Smith et al.
U.S. Office Action dated Feb. 26, 2019 issued in U.S. Appl. No. 16/206,915.
International Search Report and Written Opinion dated Mar. 13, 2019 issued in Application No. PCT/US2018/062301.

SELECTIVE GROWTH OF SILICON NITRIDE

CROSS-REFERENCE TO RELATED APPLICATION

This application claims benefit of U.S. patent application Ser. No. 15/462,695, filed Mar. 17, 2017, and titled "SELECTIVE GROWTH OF SILICON NITRIDE," which is incorporated by reference herein in its entirety and for all purposes.

BACKGROUND

Semiconductor device fabrication may involve deposition of silicon nitride films. Silicon nitride thin films have unique physical, chemical, and mechanical properties and thus are used in a variety of applications. For example, silicon nitride films may be used in diffusion barriers, gate insulators, sidewall spacers, encapsulation layers, strained films in transistors, and the like. Conventional methods of depositing silicon nitride films are not selective to dielectric materials.

SUMMARY

Provided herein are methods and apparatuses for processing semiconductor substrates. One aspect involves a method of depositing silicon nitride on a semiconductor substrate, the method including: providing the semiconductor substrate having an exposed silicon oxide surface and an exposed silicon surface; exposing the semiconductor substrate to a blocking reagent to block one of the exposed silicon oxide surface and the exposed silicon surface by forming an organic moiety on the one of the exposed silicon oxide surface and the exposed silicon surface while the other of the exposed silicon oxide surface and the exposed silicon surface remains unblocked; and selectively depositing silicon nitride on the other of the exposed silicon oxide surface and the exposed silicon surface by one or more thermal atomic layer deposition cycles, each cycle including: exposing the semiconductor substrate having the blocked and unblocked surfaces to a silicon-containing precursor to adsorb the silicon-containing precursor to the unblocked surface; and exposing the semiconductor substrate to a nitrogen-containing reactant without igniting a plasma to form silicon nitride selectively on the unblocked surface relative to the blocked surface. In various embodiments, the exposed silicon oxide surface includes hydroxyl groups.

In various embodiments, the blocking reagent is an alkene. For example, in some embodiments, the alkene is 1-octadecene.

In various embodiments, the blocking reagent is an alkylsilylhalide having a chemical structure

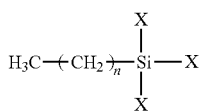

whereby X is a halogen, and n is an integer between and including 1 and 20. For example, in some embodiments, the alkylsilylhalide is octadecyltrichlorosilane.

In various embodiments, the method also includes, after selectively depositing the silicon nitride, removing the organic moiety.

In some embodiments, the organic moiety may be removed by exposing the semiconductor substrate to an inert gas selected from the group consisting of helium and argon and igniting a plasma at a plasma power between about 500 W and about 2000 W. The plasma power may be between about 500 W and about 2000 W per 300 mm wafer surface area.

In some embodiments, the organic moiety may be removed by exposing the semiconductor substrate to a mixture of a fluorine-containing gas and an oxygen-containing gas and igniting a plasma at a plasma power between about 75 W and about 200 W. The plasma power may be between about 75 W and about 200 W per 300 mm wafer surface area. The plasma may be generated remotely, such as in a remote plasma generator, or directly (i.e. in situ).

In some embodiments, the method also includes, prior to exposing the semiconductor substrate to the blocking reagent, exposing the semiconductor substrate to hydrogen to form hydrogenated groups on the exposed silicon surface.

In various embodiments, the silicon-containing precursor is a silicon halide or an aminosilane. In various embodiments, the nitrogen-containing reactant is any one of nitrogen, ammonia, a hydrazine, and a combination thereof.

The semiconductor substrate may reside on a pedestal set to a temperature between about 25° C. and about 300° C. In some embodiments, the semiconductor substrate resides in a chamber set to a chamber pressure between about 10 mTorr and about 10 Torr.

In various embodiments, each thermal atomic layer deposition cycle also includes purging a chamber housing the semiconductor substrate between exposing the semiconductor substrate to the silicon-containing precursor and exposing the semiconductor substrate to the nitrogen-containing reactant.

Another aspect involves an apparatus for processing semiconductor substrates, the apparatus including: at least one process chamber including a pedestal for holding a substrate; at least one outlet for coupling to a vacuum; one or more process gas inlets coupled to one or more alkene gas sources; one or more process gas inlets coupled to one or more silicon-containing precursor gas sources; one or more process gas inlets coupled to one or more nitrogen-containing reactant gas sources; and a controller for controlling operations in the apparatus, comprising machine-readable instructions for: introducing an alkene gas to the at least one process chamber to block silicon surfaces of the substrate housed in the at least one process chamber; and after introducing the alkene gas, introducing a silicon-containing precursor gas and a nitrogen-containing reactant gas in temporally separated pulses to form silicon nitride selectively on non-silicon surfaces of the substrate by thermal atomic layer deposition, wherein a pulse of the silicon-containing precursor gas and a pulse of the nitrogen-containing reactant gas constitutes one thermal atomic layer deposition cycle.

Another aspect involves an apparatus for processing semiconductor substrates, the apparatus including: at least one process chamber including a pedestal for holding a substrate; at least one outlet for coupling to a vacuum; one or more process gas inlets coupled to one or more alkylsilylhalide gas sources; one or more process gas inlets coupled to one or more silicon-containing precursor gas sources; one or more process gas inlets coupled to one or more nitrogen-containing reactant gas sources; and a controller for controlling operations in the apparatus, comprising machine-readable instructions for: introducing an alkylsilylhalide gas to the at least one process chamber to block silicon oxide surfaces of the substrate housed in the at least one process chamber; and after introducing the alkylsilylhalide gas, introducing a silicon-containing precursor gas and a nitrogen-containing reactant gas in temporally separated pulses to form silicon nitride selectively on non-silicon oxide surfaces of the substrate by thermal atomic layer deposition, wherein a pulse of the silicon-containing precursor gas and a pulse of the nitrogen-containing reactant gas constitutes one thermal atomic layer deposition cycle.

These and other aspects are described further below with reference to the drawings.

DETAILED DESCRIPTION

Figure 1:
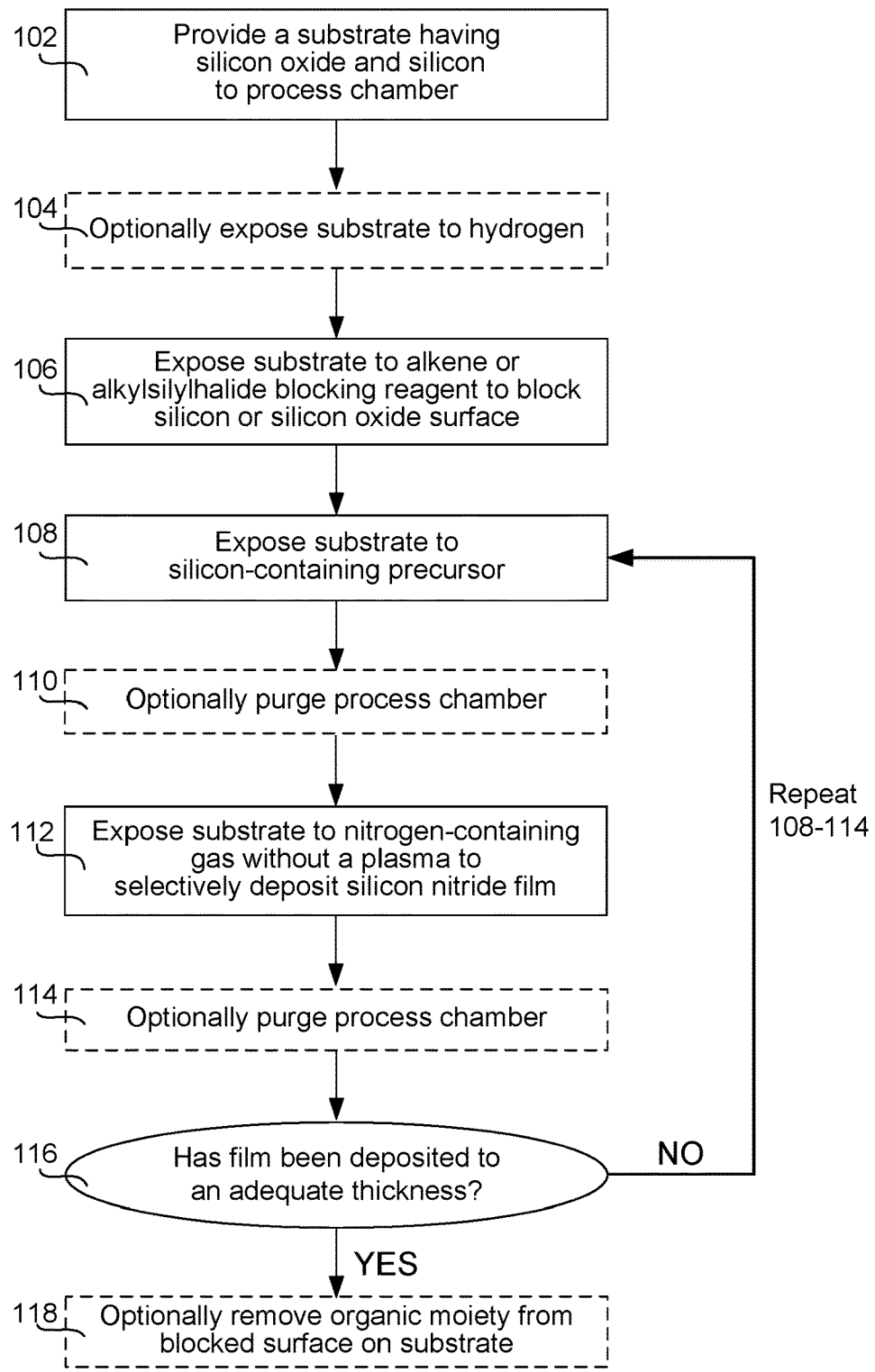
FIG. 1 is a process flow diagram depicting operations for a method in accordance with certain disclosed embodiments.

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Semiconductor fabrication processes often involve deposition of silicon nitride material. In one example, silicon nitride may be used in semiconductor device fabrication as diffusion barriers, gate insulators, sidewall spacers, and encapsulation layers. Conformal silicon nitride layers may also be used in other applications. For example, silicon nitride may be used during fabrication of memory structures.

Conventional atomic layer deposition (ALD), plasma-enhanced atomic layer deposition (PEALD), chemical vapor deposition (CVD), and plasma-enhanced chemical vapor deposition (PECVD) techniques for depositing silicon nitride layers are generally not selective to dielectric materials. Although some techniques exist for selectively depositing metal oxide on oxide materials relative to metal, and selectively depositing metal oxide on metal materials relative to oxide, such techniques are insufficient to deposit dielectric material selectively relative to other dielectric material.

Provided herein are methods of and apparatuses for selectively depositing silicon nitride on a silicon surface relative to silicon oxide and methods of and apparatuses for selectively depositing silicon nitride on a silicon oxide surface relative to silicon. Techniques described herein involve using relative reactivities of silicon oxide and silicon surfaces to block one surface while leaving the other surface unblocked such that silicon nitride is selectively deposited on the unblocked surface. The substrate is exposed to an organic blocking reagent selected to either block the silicon surface or the silicon oxide surface by forming an organic group or moiety on the surface to be blocked, leaving the silicon oxide surface or silicon surface, respectively, unblocked. Deposition of silicon nitride is performed using thermal atomic layer deposition (ALD) such that deposition is performed without a plasma. In many embodiments, igniting a plasma will remove the organic group or moiety, thereby causing the blocked surface to be susceptible to silicon nitride deposition. Thus, ALD is performed without igniting a plasma.

ALD is a technique that deposits thin layers of material using sequential self-limiting reactions. Typically, an ALD cycle includes operations to deliver and adsorb at least one reactant to the substrate surface, and then react the adsorbed reactant with one or more reactants to form the partial layer of film. As an example, a silicon oxide deposition cycle may include the following operations: (i) delivery/adsorption of a silicon-containing precursor, (ii) purging of the silicon precursor from the chamber, (iii) delivery of an oxygen-containing reactant or oxygen-containing gas, and (iv) purging of the oxygen-containing reactant from the chamber.

Unlike a chemical vapor deposition (CVD) technique, ALD processes use surface-mediated deposition reactions to deposit films on a layer-by-layer basis. In one example of an ALD process, a substrate surface that includes a population of surface active sites is exposed to a gas phase distribution of a first precursor, such as a silicon-containing precursor, in a dose provided to a chamber housing a substrate. Molecules of this first precursor are adsorbed onto the substrate surface, including chemisorbed species and/or physisorbed molecules of the first precursor. It should be understood that when the compound is adsorbed onto the substrate surface as described herein, the adsorbed layer may include the compound as well as derivatives of the compound. For example, an adsorbed layer of a silicon-containing precursor may include the silicon-containing precursor as well as derivatives of the silicon-containing precursor. After a first precursor dose, the chamber is then evacuated to remove most or all of first precursor remaining in gas phase so that mostly or only the adsorbed species remain. In some implementations, the chamber may not be fully evacuated. For example, the chamber may be evacuated such that the partial pressure of the first precursor in gas phase is sufficiently low to mitigate a reaction. A second reactant, such as a nitrogen-containing reactant, is introduced to the chamber so that some of these molecules react with the first precursor adsorbed on the surface. In some processes, the second reactant reacts immediately with the adsorbed first precursor. The chamber may then be evacuated again to remove unbound second reactant molecules. As described above, in some embodiments the chamber may not be completely evacuated. Additional ALD cycles may be used to build film thickness.

In certain embodiments, an ALD first precursor dose partially saturates the substrate surface. In some embodiments, the dose phase of an ALD cycle concludes before the precursor contacts the substrate to evenly saturate the surface. Typically, the precursor flow is turned off or diverted at this point, and only purge gas flows. By operating in this sub-saturation regime, the ALD process reduces the cycle time and increases throughput. However, because precursor adsorption is not saturation limited, the adsorbed precursor concentration may vary slightly across the substrate surface. Examples of ALD processes operating in the sub-saturation regime are provided in U.S. patent application Ser. No. 14/061,587 (now U.S. Pat. No. 9,355,839), filed Oct. 23, 2013, titled "SUB-SATURATED ATOMIC LAYER DEPOSITION AND CONFORMAL FILM DEPOSITION," which is incorporated herein by reference in its entirety.

As described, in some implementations, the ALD methods include plasma activation. As described herein, the ALD methods and apparatuses described herein may be conformal film deposition (CFD) methods, which are described generally in U.S. patent application Ser. No. 13/084,399 (now U.S. Pat. No. 8,728,956), filed Apr. 11, 2011, and titled "PLASMA ACTIVATED CONFORMAL FILM DEPOSITION," and in U.S. patent application Ser. No. 13/084,305, filed Apr. 11, 2011, and titled "SILICON NITRIDE FILMS AND METHODS," which are herein incorporated by reference in their entireties.

FIG. 1 provides a process flow diagram depicting example operations of a method performed in accordance with certain disclosed embodiments. In operation 101, a substrate having an exposed silicon oxide surface and exposed silicon surface is provided to a process chamber. The process chamber may be set to a chamber pressure between about 10 mTorr and about 10 Torr, or between about 1 Torr and about 3 Torr. Such chamber pressures may be used throughout operations 102-114 as described herein. The substrate may be heated to a substrate temperature between about 25° C. and about 400° C., or between about 200° C. and about 300° C. It will be understood that substrate temperature as used herein refers to the temperature that the pedestal holding the substrate is set at and that in some embodiments, the substrate when provided to the process chamber on the pedestal may be heated to the desired substrate temperature prior to processing the substrate. The substrate temperature may be the same throughout operations 102-114 as described herein.

The substrate may be a silicon wafer, e.g., a 200-mm wafer, a 300-mm wafer, or a 450-mm wafer, including wafers having one or more layers of material, such as dielectric, conducting, or semi-conducting material deposited thereon. Non-limiting examples of under-layers include dielectric layers and conducting layers, e.g., silicon oxides, silicon nitrides, silicon carbides, metal oxides, metal nitrides, metal carbides, and metal layers. In some embodiments, the substrate includes silicon oxide and silicon, as shown in FIG. 2.

Figure 2:
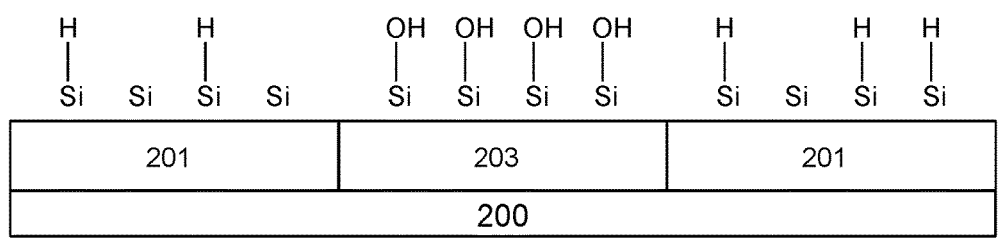
FIGS. 2 and 3 are schematic illustrations of substrates undergoing operations described in accordance with certain disclosed embodiments.
Figure 3:
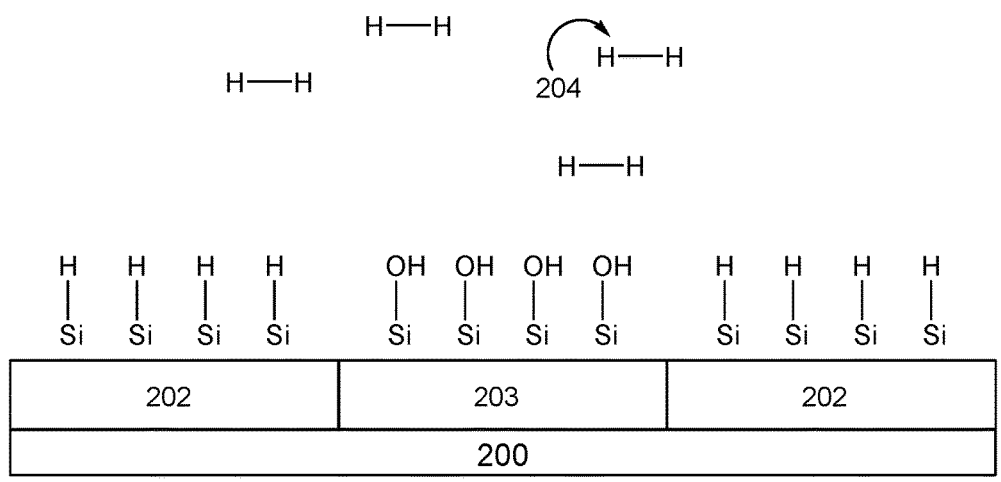

FIG. 2 shows a substrate 200 having an exposed silicon oxide surface 203 and exposed silicon surfaces 201. Exposed silicon surfaces 201 include some hydrogenated silicon atoms. Although two exposed silicon surfaces 201 are depicted in FIG. 2, it will be understood that one or multiple exposed silicon surfaces may be present on the substrate 200. An exposed silicon surface 201 is a hydrogen-terminated silicon surface, such as the surface of poly-silicon or amorphous silicon. A hydrogen-terminated silicon surface may be formed by exposing the substrate to a hydrogen gas to hydrogenate the silicon atoms on the surface of the substrate. In some embodiments, the silicon surfaces as deposited are hydrogenated. In some embodiments, as noted in operation 104 of FIG. 1, the substrate may be optionally exposed to hydrogen to hydrogenate the silicon surfaces. As shown in FIG. 3, hydrogen 204 is introduced to form fully hydrogenated silicon surface 202.

The exposed silicon oxide surface 203 of FIG. 2 includes hydroxyl end groups, which may be formed from ambient air ($H_2O$ and $O_2$) or from a mild etchant such as 1% hydrofluoric acid (HF) in $H_2O$. The hydroxyl end groups on the exposed silicon oxide surface 203 may also be formed due to the technique used to form the silicon oxide material. For example, vapor processes for depositing silicon oxide may result in a hydroxyl-terminated surface on the silicon oxide material. Example vapor processes include chemical vapor deposition (CVD) and atomic layer deposition (ALD). Although one exposed silicon oxide surface 203 is depicted in FIG. 2, it will be understood that one or more surfaces on the substrate may include silicon oxide.

Returning to FIG. 1, in operation 106, the substrate is exposed to an alkene or an alkylsilylhalide blocking reagent to form an organic group or moiety on the silicon or silicon oxide surface respectively to thereby block the respective surface. A plasma is not ignited in operation 106.

The substrate is exposed to an alkene in embodiments where the silicon surface is to be blocked and material is to be deposited selectively on non-silicon surfaces of the substrate. For example, alkene is used to block silicon surfaces such that silicon nitride can be deposited selectively on silicon oxide surfaces. The organic moiety formed on the exposed silicon surface prevents adsorption of the silicon-containing precursor during deposition of silicon nitride such that silicon nitride is selectively formed on the other surfaces (e.g., a silicon oxide surface).

Alkenes suitable for use in operation 106 may have a general chemical structure of:

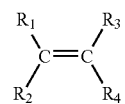

where $R_1$, $R_2$, $R_3$, and $R_4$ may each be a hydrogen atom or an alkyl group. For example, in some embodiments, the alkene may have a structure of:

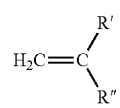

whereby R' and R" are alkyl groups. One specific example is 1-octadecene, which may have the structure:

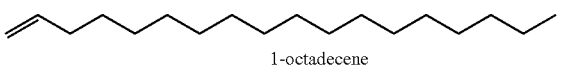 [SMILES: C=CCCCCCCCCCCCCCCCC]

1-octadecene

Figure 4A:
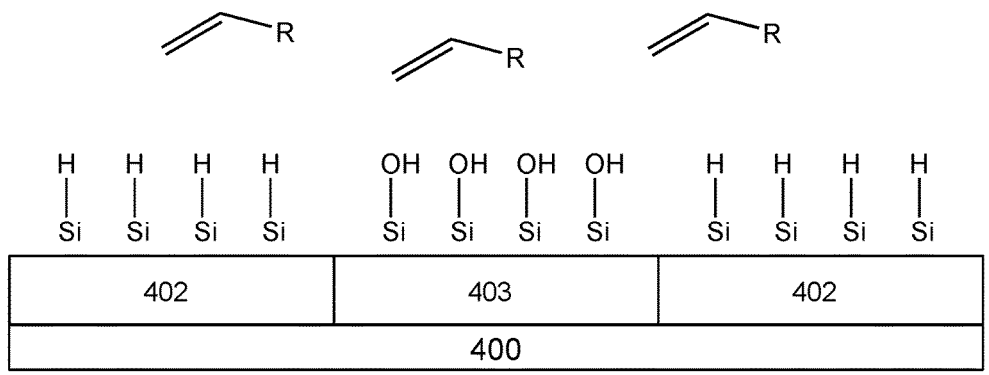
FIGS. 4A-4C are schematic illustrations of substrates undergoing operations described in accordance with certain disclosed embodiments.
Figure 4B:
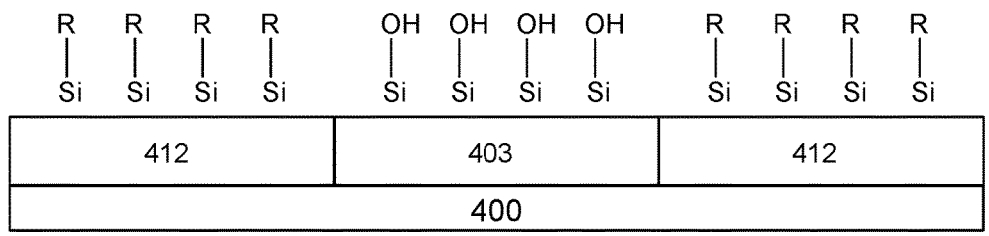

Alkenes are selected to be selectively reactive with the Si—H groups on the surface of the silicon surface such that the organic group bonds to the silicon atom, thereby rendering the surface non-reactive or having little reactivity with subsequent film deposition chemistry. An example is provided in FIG. 4A, whereby an alkene having the formula $CH_2CHR$ is introduced to a substrate 400 having exposed silicon surfaces 402 and exposed silicon oxide surfaces 403 having hydroxyl groups. The substrate 400 in FIG. 4A is similar to that of FIG. 3, whereby the silicon surface is hydrogenated. In FIG. 4B, the exposed silicon surfaces 402 of FIG. 4A have reacted with the alkene $CH_2CHR$ to form blocked silicon surfaces 412 having Si—R groups on the surface. Since the alkene selected has little to no reactivity with the hydroxyl-terminated silicon oxide surface 403, the exposed silicon oxide surface 403 remains unreacted.

In operation 106 of FIG. 1, the substrate is exposed to an alkylsilylhalide where the silicon oxide surface having hydroxyl-terminated groups is to be blocked and material is to be deposited selectively on non-silicon-oxide surfaces of the substrate. Alkylsilylhalides used herein may have the chemical structure:

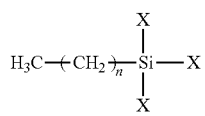

where X is a halogen, such as chlorine, and n is an integer between and including 1 and 20. One example alkylsilylhalide may be octadecyltrichlorosilane, which has the chemical structure:

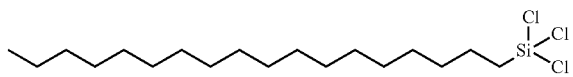 [SMILES: CCCCCCCCCCCCCCCCCC[Si](Cl)(Cl)Cl]

Figure 5A:
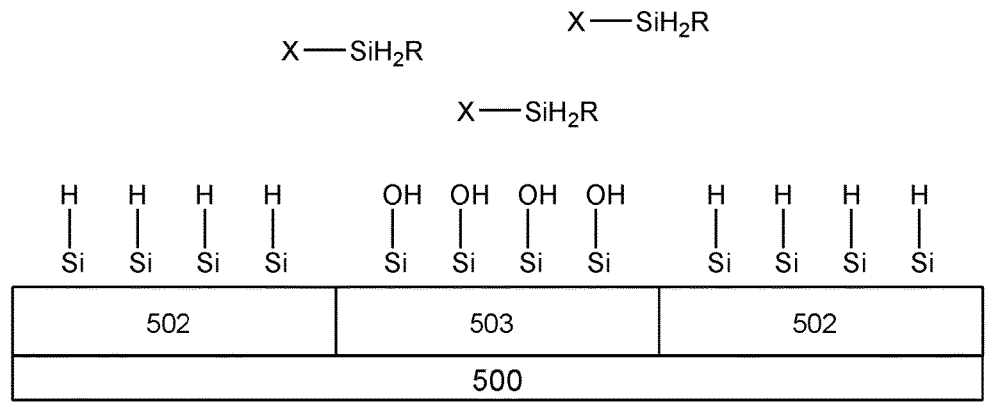
FIGS. 5A-5C are schematic illustrations of substrates undergoing operations described in accordance with certain disclosed embodiments.
Figure 5B:
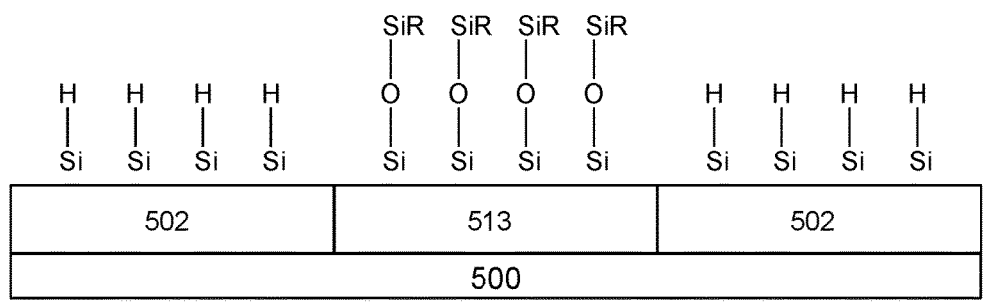

Alkylsilylhalides are selected to be selectively reactive with the Si—OH groups on the surface of the silicon oxide surface such that the organic group bonds to the silicon atom, thereby rendering the surface non-reactive or having little reactivity with subsequent film deposition chemistry. An example is provided in FIG. 5A, whereby an alkylsilylhalide (X—SiH$_2$R) is introduced to a substrate 500 having exposed silicon surfaces 502 and exposed silicon oxide surfaces 503 having hydroxyl groups. In FIG. 5B, the exposed silicon oxide surfaces 503 of FIG. 5A have reacted with the alkylsilylhalide to form blocked silicon oxide surfaces 513 having Si—O—R groups on the surface. Since the alkylsilylhalide selected has little to no reactivity with the hydrogen-terminated silicon surfaces 502, the exposed silicon surfaces 502 remains unreacted.

Returning to FIG. 1, in operation 108, the substrate is exposed to a silicon-containing precursor. The silicon-containing precursor adsorbs onto the non-blocked surface of the substrate. In some embodiments, even if the silicon-containing precursor adsorbs onto any portion of the blocked surface, the precursor is not able to completely adsorb onto the bulky organic groups and subsequent purge operations may easily remove the precursor from the blocked surfaces. Operations 108-114 may constitute an atomic layer deposition cycle. Embodiments described herein involve thermal atomic layer deposition performed in cycles such that plasma is not ignited during either of silicon-containing precursor exposure or exposure to a nitrogen-containing reactant.

The silicon-containing precursor used during operation 108 may be an aminosilane in some embodiments. Aminosilanes referred to herein include aminosilanes, such as bis(tertbutyl)aminosilane and silylamines such as trisilylamine. In some embodiments, aminosilane molecules may adsorb onto both blocked and unblocked surfaces, but as described below with respect to operation 112, silicon nitride is formed selectively on unblocked surfaces and not on the blocked surfaces. In various embodiments, subsequent purge operations as described below with respect to operations 110 and 114 may remove adsorbed aminosilane from the blocked surfaces.

In some embodiments, adsorption on the surface of the substrate may be form a thin layer of the aminosilane on the surface of the substrate. The thin layer may be less than a monolayer, and may have a thickness between about 0.2 Å and about 0.4 Å.

During operation 108, an inert gas may be flowed. The inert gas may be any inert gas, such as those listed above with respect to operation 108. The inert gas may be provided to assist with pressure and/or temperature control of the process chamber, evaporation of a liquid reactant, more rapid delivery of the reactant and/or as a sweep gas for removing process gases from the process chamber and/or process chamber plumbing.

The aminosilane used in operation 108 has a chemical structure as follows:

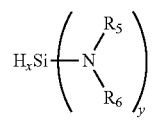

where x is an integer between and including 1 and 3, x+y=4, and each of R$_5$ and R$_6$ is a hydrogen atom or an alkyl ligand. For example, in some embodiments, the aminosilane is monoaminosilane, which has the chemical structure:

where each of R$_1$ and R$_2$ is hydrogen or an alkyl ligand.

The aminosilane in some embodiments may be any of monoaminosilane, diaminosilane, triaminosilane, tetraaminosilane, and combinations thereof. Chemical structures for these examples are provided below:

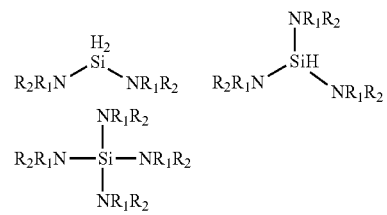

As noted above, R$_1$ and R$_2$ may be any alkyl ligand. In one example, the aminosilane may be N,N'-dimethylsilanediamine, having the structure:

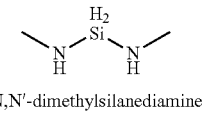

N,N'-dimethylsilanediamine

Other silicon-containing precursors include silicon alkoxides and silicon halides, which may be used in some embodiments. In some embodiments, silicon halides that may be used include but are not limited to silicon chloride, silicon bromide, and silicon iodide.

In operation 110, the process chamber is optionally purged to remove silicon-containing precursor molecules that did not adsorb onto the substrate surface. Purging may remove silicon-containing precursor molecules from the blocked surfaces, which have bulky organic groups and are less susceptible to adsorption of the silicon-containing precursor.

Purging the chamber may involve flowing a purge gas or a sweep gas, which may be a carrier gas used in other operations or may be a different gas. In some embodiments, purging may involve evacuating the chamber. Example purge gases include argon, nitrogen, hydrogen, and helium. In various embodiments, the purge gas is an inert gas. The purge gas may include one or more gases. In some embodiments, operation 110 may include one or more evacuation subphases for evacuating the process chamber. Alternatively, it will be appreciated that operation 110 may be omitted in some embodiments. Operation 110 may have any suitable duration, such as between about 0 seconds and about 60 seconds, for example about 0.01 seconds. In some embodiments, increasing a flow rate of one or more purge gases may decrease the duration of operation 110. For example, a purge gas flow rate may be adjusted according to various reactant thermodynamic characteristics and/or geometric characteristics of the process chamber and/or process chamber plumbing for modifying the duration of operation 110. In one non-limiting example, the duration of a purge phase may be adjusted by modulating purge gas flow rate. This may reduce deposition cycle time, which may improve substrate throughput. After a purge, the silicon-containing precursor molecules remain adsorbed onto the substrate surface. In some embodiments, the silicon-containing precursor is flowed to a chamber housing the substrate at a flow rate between about 1000 sccm and about 5000 sccm.

Figure 4C:
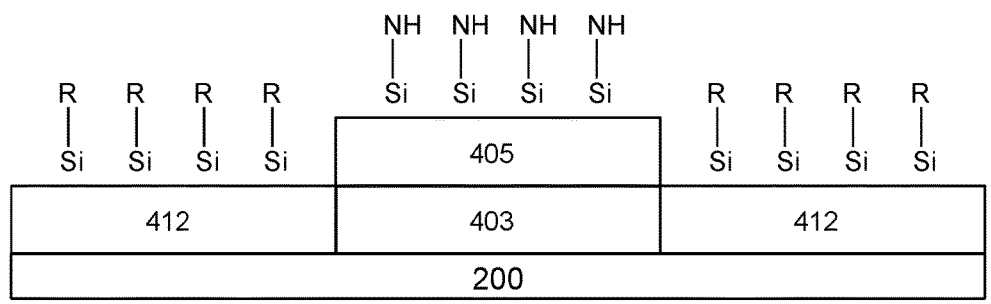
Figure 5C:
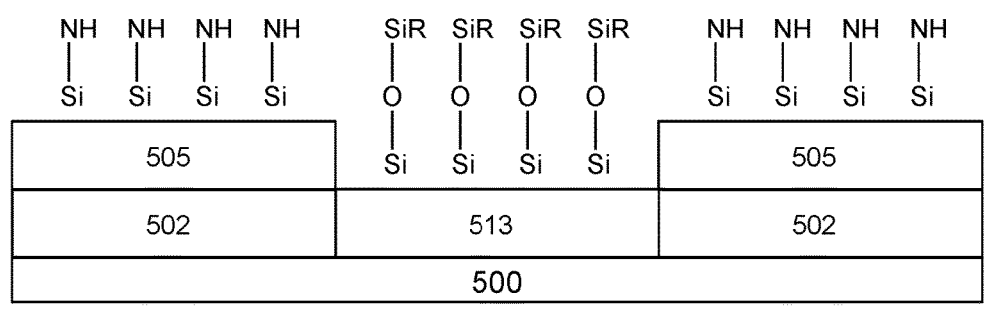

In operation 112, the substrate is exposed to a nitrogen-containing reactant gas without a plasma to selectively form silicon nitride on the unblocked surface, relative to blocked surfaces. In various embodiments, the nitrogen-containing reactant is nitrogen gas. In various embodiments, the nitrogen-containing reactant is a hydrazine. In some embodiments, the nitrogen-containing reactant is ammonia. As shown in FIG. 4C, silicon nitride 415 is selectively formed on the unblocked surface (the hydroxyl-terminated silicon oxide surfaces 403) while the blocked silicon surface 412 remains blocked and no silicon nitride is deposited thereon. In FIG. 5C, silicon nitride 515 is selected form on the unblocked surface (the hydrogen-terminated silicon surface 502) while the blocked silicon oxide surface 513 remains blocked and no silicon nitride is deposited thereon.

As described above, in some embodiments, the nitrogen-containing reactant gas may be nitrogen, ammonia, a hydrazine, or combinations thereof. Hydrazines used during operation 112 have the structure:

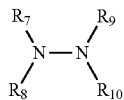

where $R_7$, $R_8$, $R_9$, and $R_{10}$ are each a hydrogen atom or an alkyl group. For example, hydrazine may be used, whereby hydrazine has the structure:

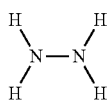

In another example, t-butylhydrazine, which has the following structure, may be used:

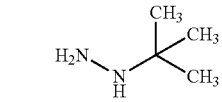

In another example, tetramethyl hydrazine, which has the following structure, may be used:

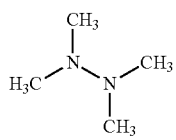

In some embodiments, one or more hydrazines may be introduced as a mixture. Hydrazines may be delivered to the substrate as a gas. In some embodiments, a hydrazine may be delivered using a carrier gas such that the carrier gas and hydrazine gas co-flow to the substrate. In some embodiments, the carrier gas may be an inert gas, such as those described above with respect to operation 108. In some embodiments, the carrier gas is diverted prior to delivering the hydrazine gas into a chamber housing the substrate. In some embodiments, a hydrazine may be vaporized from liquid phase upstream of the substrate and introduced into the chamber as a gas. A vaporized hydrazine may likewise be introduced using a carrier gas by co-flowing the vaporized hydrazine precursor with the carrier gas. Similarly, the carrier gas may be diverted in some embodiments prior to delivering the vaporized hydrazine precursor to the substrate. A hydrazine used in operation 112 may be delivered to a chamber housing the substrate at a flow rate between about 100 sccm and about 10000 sccm, or between about 1000 sccm and about 5000 sccm. As described above, the chamber pressure of the chamber housing the substrate may be constant throughout operations 102-118. That is, in various embodiments, the chamber pressure during operation 112 is the same as the chamber pressure during operations 108, 110, and 114. In various embodiments the chamber pressure during operation 112 may be the same as the chamber pressure during operations 104, or operation 106, or both operations 104 and 106.

In operation 114, the chamber is optionally purged to remove any residual byproducts. Operation 114 may be performed using any of the conditions described above with respect to operation 110. For example, in some embodiments, the chamber is purged by flowing an inert gas, such as argon, to pump excess molecules and/or residual byproducts from the chamber.

In operation 116, it is determined whether the desired thickness of silicon nitride film has been deposited. If not, operations 108-114 are repeated in sufficient cycles to deposit a desired thickness of silicon nitride. Any suitable number of deposition cycles may be included in an ALD process to deposit a desired film thickness of silicon nitride. For example, about 20 to about 40 deposition cycles may be performed to deposit a silicon nitride film on the substrate using disclosed embodiments. In some embodiments, 20 to 40 depositions are performed.

Note that in some embodiments, operation 112 is performed prior to operation 108. In some embodiments, operation 108 is performed prior to operation 112. In various embodiments, the chamber is purged between alternating exposures of operation 112 and operation 108.

In some embodiments, after sufficient cycles are performed to deposit the desired amount of silicon nitride selectively on either silicon or silicon oxide surfaces, the substrate may be subject to a removal operation 118 to remove the organic moieties or organic group(s) from the blocked surfaces of the substrate.

For removing the organic groups from a blocked silicon surface, the substrate may be exposed to argon, or helium gas, or a mixture of argon and helium gas while igniting a plasma to remove by sputtering using high plasma powers such as between about 500 W and about 2000 W per surface area of a 300 mm wafer. In various embodiments, such high plasma powers may be sufficient to both heat the substrate and remove the organic groups from a blocked silicon surface.

In some embodiments, for removing the organic groups from a blocked silicon oxide surface, the substrate may be exposed to argon and/or helium gas while igniting a plasma to remove by sputtering using high plasma powers such as between about 500 W and about 2000 W per surface area of a 300 mm wafer. In various embodiments, such high plasma powers may be sufficient to both heat the substrate and remove the organic groups from a blocked silicon surface. In some embodiments, for removing the organic groups from a blocked silicon oxide surface, the substrate may be exposed to argon and/or helium gas while a plasma is ignited, or may be exposed to fluorine-containing gas, oxygen gas, or a mixture of fluorine-containing and oxygen gas while igniting a plasma. The plasma may be generated remotely (such as in a remote plasma generator) or directly in a chamber housing the substrate (i.e. in situ). In various embodiments where organic groups are removed from a blocked silicon oxide surface using a mixture of fluorine-containing and oxygen gas, a high oxygen gas to fluorine-containing gas flow rate ratio is used, such as about 50:1 of $O_2$ to $NF_3$. For example, in some embodiments, about 5000 sccm of oxygen may be flowed with about 100 sccm of $NF_3$. The power of the plasma ignited while flowing the fluorine-containing gas, oxygen gas, or mixture of fluorine-containing and oxygen gas may be between about 75 W and about 200 W per surface area of a 300 mm wafer. The plasma power is selected to be low to prevent sputtering of material on the surface of the substrate.

Figure 6:
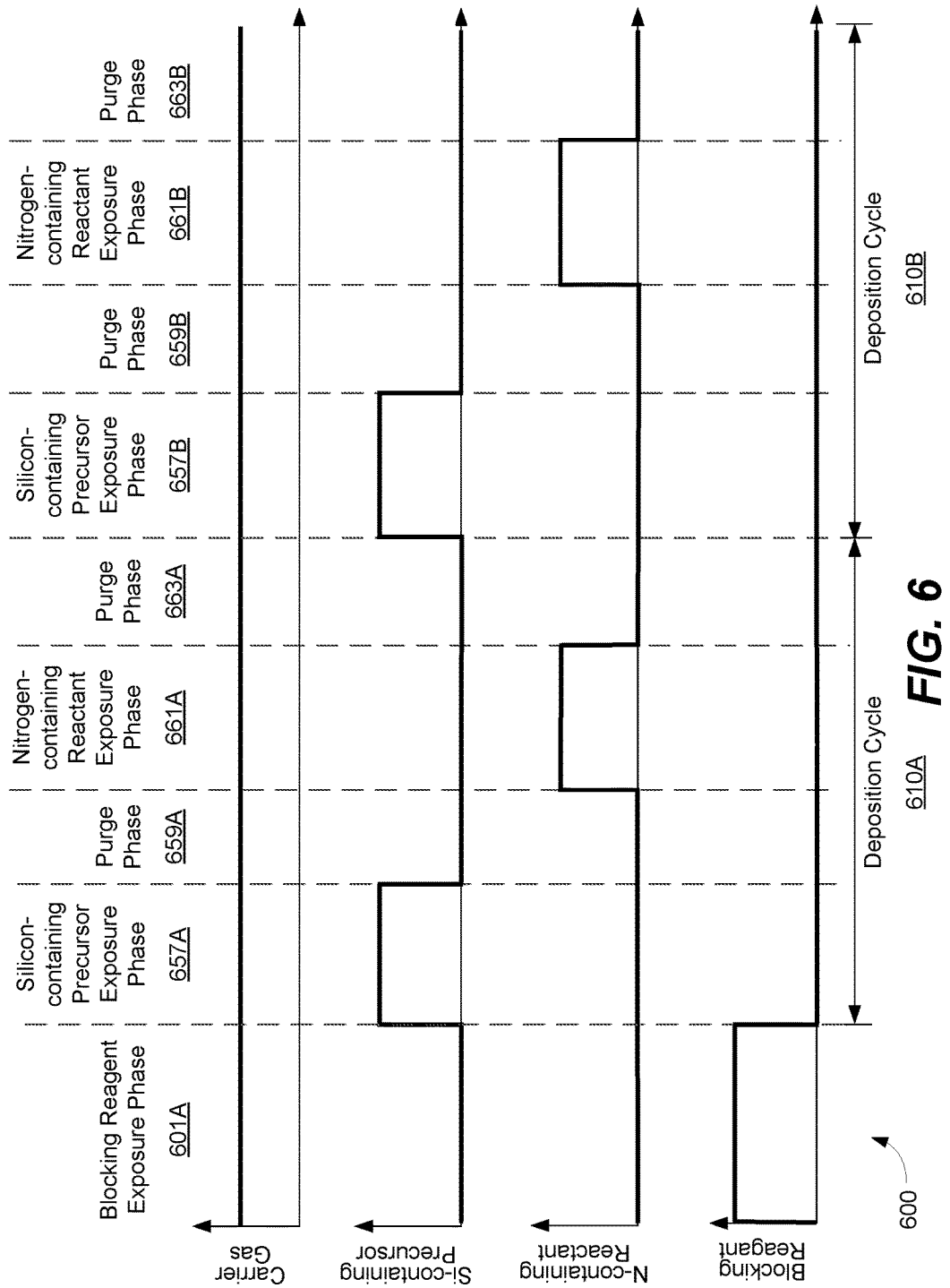
FIG. 6 is a timing sequence diagram showing an example of cycles in a method in accordance with certain disclosed embodiments.

FIG. 6 provides a timing sequence diagram showing an example of cycles in a method in accordance with certain disclosed embodiments. The timing sequence diagram shows the on or off phase for flows of a carrier gas, silicon-containing precursor gas, nitrogen-containing reactant gas, and blocking reagent gas such as an alkene or alkylsilylhalide. FIG. 6 includes a process 600 having a blocking reagent exposure phase 601A and two deposition cycles—deposition cycle 610A and deposition cycle 610B. Note that although only two deposition cycles are depicted, more deposition cycles may be performed.

During blocking reagent exposure phase 601A, carrier gas may flow. In some embodiments, the carrier gas may be used to deliver the blocking reagent and then diverted upstream of a showerhead for delivering the blocking reagent into the chamber. In some embodiments, the carrier gas is an inert gas. In some embodiments, the carrier gas and the blocking reagent gas are both delivered to the substrate. During this phase, silicon-containing precursor gas flow is turned off, nitrogen-containing reactant gas flow is turned off, and blocking reagent gas flow is turned on. This phase may correspond to operation 108 of FIG. 1.

Following blocking reagent exposure phase 601A, deposition cycle 610A is performed. Deposition cycle 610A includes silicon-containing precursor exposure phase 657A, purge phase 659A, nitrogen-containing reactant exposure phase 661A, and purge phase 663A. During silicon-containing precursor exposure phase 657A, the carrier gas flow may continue to be on while the silicon-containing precursor gas flow is turned on. Nitrogen-containing reactant gas flow remains off and blocking reagent gas flow is turned off. This may correspond to operation 110 of FIG. 1. During purge phase 659A, the carrier gas may continue to flow. In some embodiments the carrier gas may act as a purge gas to help remove excess molecules from the chamber. During this phase, the silicon-containing precursor gas flow is turned off, the nitrogen-containing reactant gas flow is off, and the blocking reagent gas flow is also turned off. This may correspond to operation 112 of FIG. 1. During nitrogen-containing reactant exposure phase 661A, a carrier gas may continue to flow. In some embodiments, the carrier gas is used to help deliver a nitrogen-containing reactant gas to the chamber and may be diverted or flowed into the chamber. During this phase, silicon-containing precursor gas flow is turned off and blocking reagent gas flow is turned off while nitrogen-containing reactant gas flow is turned on. This may correspond to operation 114 of FIG. 1. During purge phase 663A, the carrier gas flow may continue to be on and the carrier gas may act as a purge gas to remove excess molecules and/or byproducts from the chamber. Silicon-containing precursor gas flow, nitrogen-containing reactant gas flow, and blocking reagent gas flow are turned off. In this example of FIG. 6, it is determined that the silicon nitride film deposited is of insufficient thickness and another deposition cycle 610B is performed. Deposition cycle 610B includes silicon-containing precursor exposure phase 657B, purge phase 659B, nitrogen-containing reactant exposure phase 661B, and purge phase 663B. During silicon-containing precursor exposure phase 657B, a carrier gas may be flowed and a silicon-containing precursor gas flow is turned on, while nitrogen-containing reactant gas flow and blocking reagent gas flow are turned off. This may correspond to a repeated operation of operation 108 of FIG. 1 after determining in operation 116 that the film is not deposited to an adequate thickness. During purge phase 659B, the carrier gas flow remains on while silicon-containing precursor gas flow is turned off and both nitrogen-containing reactant gas flow and blocking reagent gas flow remain off. This may correspond to a repeated operation of operation 110 of FIG. 1. During nitrogen-containing reactant exposure phase 661B, the carrier gas flow may remain on while the nitrogen-containing reactant gas flow is turned on and silicon-containing precursor gas flow and blocking reagent gas flow are turned off. This may correspond to a repeated operation of operation 112 of FIG. 1. During purge phase 663B, the carrier gas flow may remain on while the silicon-containing precursor gas flow, nitrogen-containing reactant gas flow, and blocking reagent gas flows are turned off. Although two deposition cycles are depicted in FIG. 6, it will be understood that additional deposition cycles may also be performed. It will also be understood that in some embodiments, after the desired number of deposition cycles are performed, an additional removal species exposure phase (not shown) may be performed to remove the organic groups from the blocked surfaces of the substrate.

Apparatus

Figure 7:
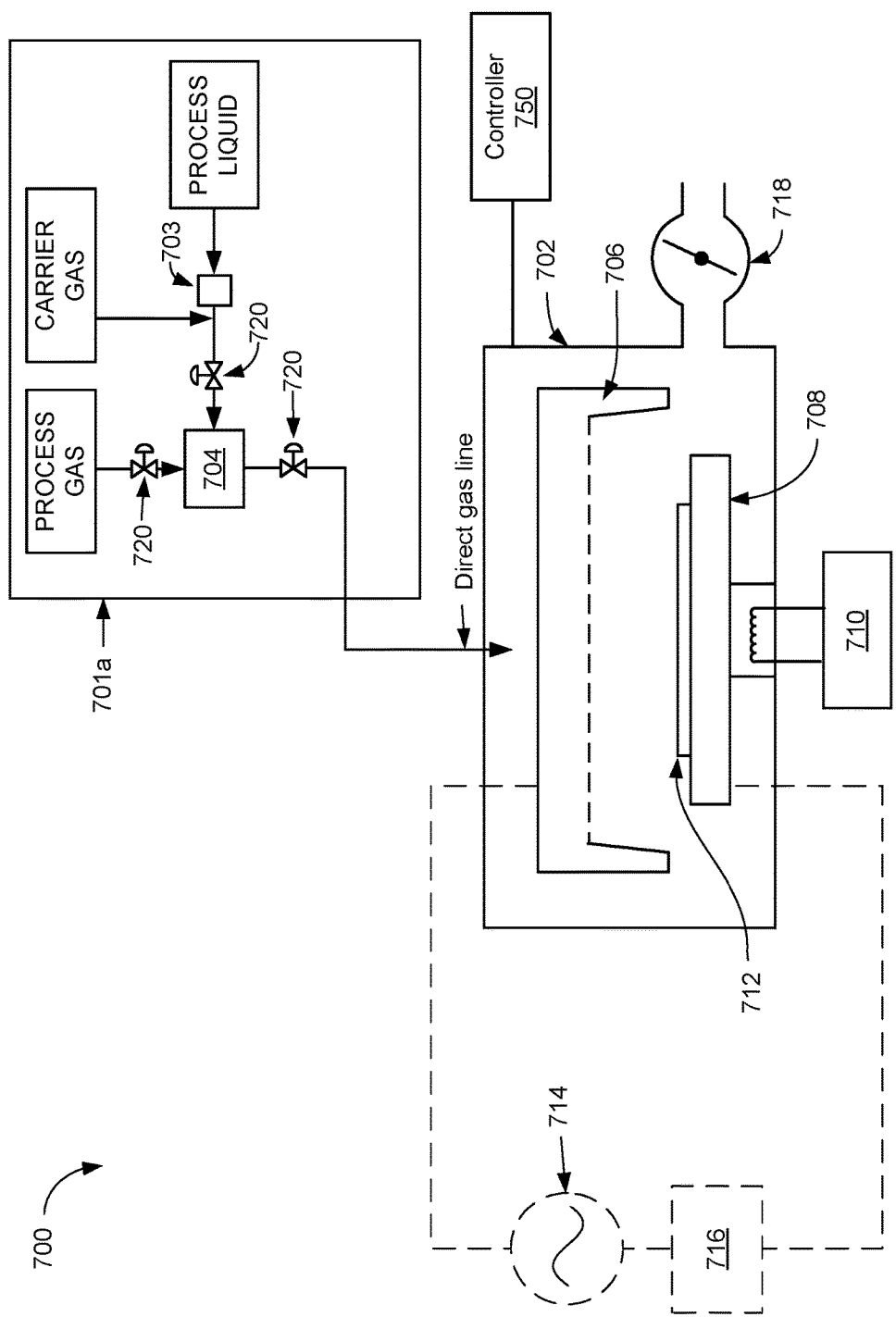
FIG. 7 is a schematic diagram of an example process chamber for performing certain disclosed embodiments.
Figure 8:
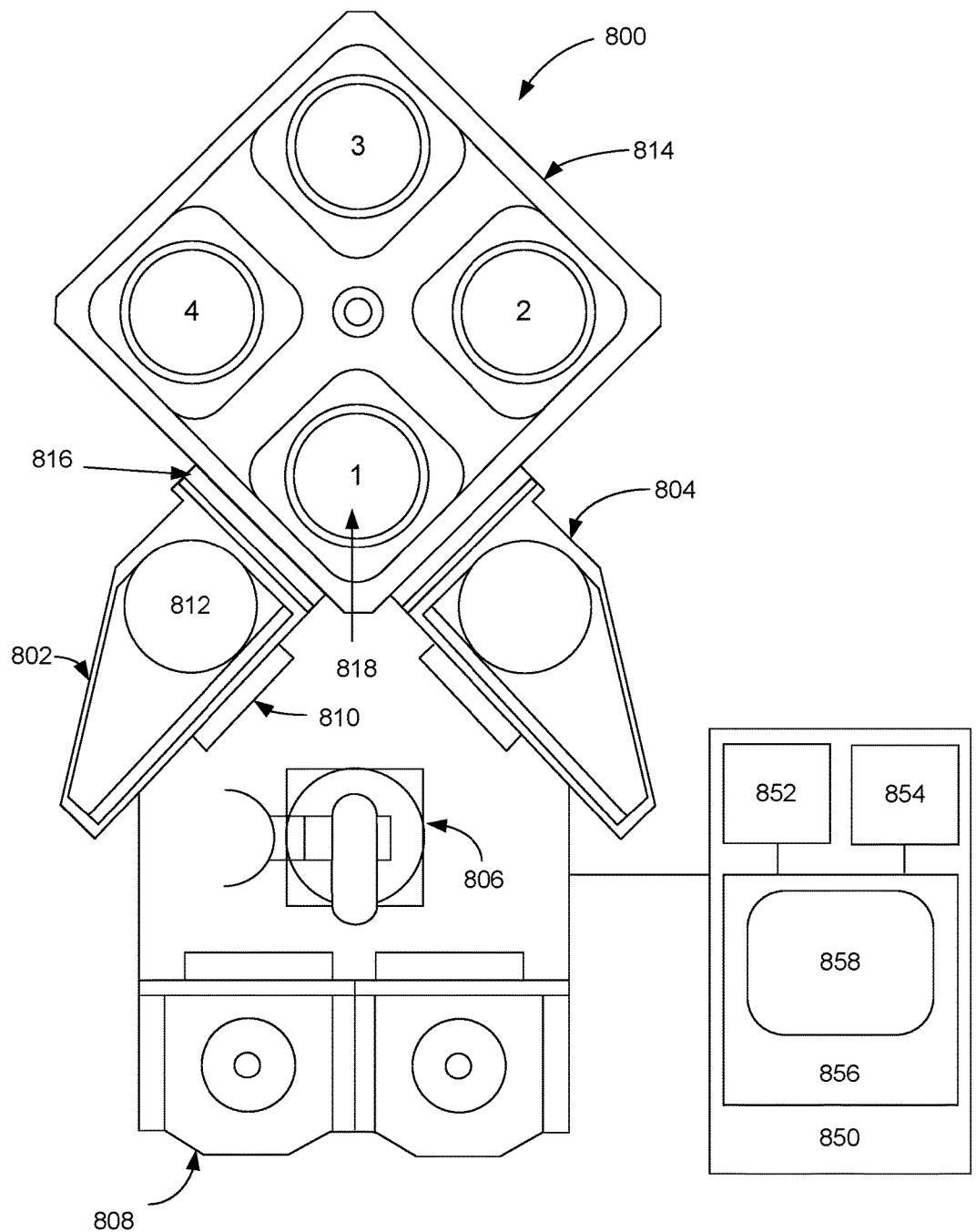
FIG. 8 is a schematic diagram of an example process tool for performing certain disclosed embodiments.

FIG. 7 depicts a schematic illustration of an embodiment of an atomic layer deposition (ALD) process station 700 having a process chamber body 702 for maintaining a low-pressure environment. A plurality of ALD process stations 700 may be included in a common low pressure process tool environment. For example, FIG. 8 depicts an embodiment of a multi-station processing tool 800. In some embodiments, one or more hardware parameters of ALD process station 700 including those discussed in detail below may be adjusted programmatically by one or more computer controllers 750.

ALD process station 700 fluidly communicates with reactant delivery system 701a for delivering process gases to a distribution showerhead 706. Reactant delivery system 701a includes a mixing vessel 704 for blending and/or conditioning process gases, such as an alkene gas, or an alkylsilyl-halide gas, or a silicon-containing precursor gas, or nitrogen-containing gas, for delivery to showerhead 706. One or more mixing vessel inlet valves 720 may control introduction of process gases to mixing vessel 704.

As an example, the embodiment of FIG. 7 includes a vaporization point 703 for vaporizing liquid reactant to be supplied to the mixing vessel 704. In some embodiments, vaporization point 703 may be a heated vaporizer. The saturated reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve purging and/or evacuating the delivery piping to remove residual reactant. However, purging the delivery piping may increase process station cycle time, degrading process station throughput. Thus, in some embodiments, delivery piping downstream of vaporization point 703 may be heat traced. In some examples, mixing vessel 704 may also be heat traced. In one non-limiting example, piping downstream of vaporization point 703 has an increasing temperature profile extending from approximately 100° C. to approximately 150° C. at mixing vessel 704.

In some embodiments, liquid precursor or liquid reactant may be vaporized at a liquid injector. For example, a liquid injector may inject pulses of a liquid reactant into a carrier gas stream upstream of the mixing vessel. In one embodiment, a liquid injector may vaporize the reactant by flashing the liquid from a higher pressure to a lower pressure. In another example, a liquid injector may atomize the liquid into dispersed microdroplets that are subsequently vaporized in a heated delivery pipe. Smaller droplets may vaporize faster than larger droplets, reducing a delay between liquid injection and complete vaporization. Faster vaporization may reduce a length of piping downstream from vaporization point 703. In one scenario, a liquid injector may be mounted directly to mixing vessel 704. In another scenario, a liquid injector may be mounted directly to showerhead 706.

In some embodiments, a liquid flow controller (LFC) upstream of vaporization point 703 may be provided for controlling a mass flow of liquid for vaporization and delivery to process station 700. For example, the LFC may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, this may be performed by disabling a sense tube of the LFC and the PID controller.

Showerhead 706 distributes process gases toward substrate 712. In the embodiment shown in FIG. 7, the substrate 712 is located beneath showerhead 706 and is shown resting on a pedestal 708. Showerhead 706 may have any suitable shape, and may have any suitable number and arrangement of ports for distributing process gases to substrate 712.

In some embodiments, pedestal 708 may be raised or lowered to expose substrate 712 to a volume between the substrate 712 and the showerhead 706. It will be appreciated that, in some embodiments, pedestal height may be adjusted programmatically by a suitable computer controller 750.

In another scenario, adjusting a height of pedestal 708 may allow a plasma density to be varied during plasma activation in the process in embodiments where a plasma is ignited. At the conclusion of the process phase, pedestal 708 may be lowered during another substrate transfer phase to allow removal of substrate 712 from pedestal 708.

In some embodiments, pedestal 708 may be temperature controlled via heater 710. In some embodiments, the pedestal 708 may be heated to a temperature of between about 25° C. and about 400° C., or between about 200° C. and about 300° C., during selective deposition of silicon nitride films as described in disclosed embodiments. In some embodiments, the pedestal is set at a temperature between about 25° C. and about 400° C., or between about 200° C. and about 300° C.

Further, in some embodiments, pressure control for process station 700 may be provided by butterfly valve 718. As shown in the embodiment of FIG. 7, butterfly valve 718 throttles a vacuum provided by a downstream vacuum pump (not shown). However, in some embodiments, pressure control of process station 700 may also be adjusted by varying a flow rate of one or more gases introduced to the process station 700.

In some embodiments, a position of showerhead 706 may be adjusted relative to pedestal 708 to vary a volume between the substrate 712 and the showerhead 706. Further, it will be appreciated that a vertical position of pedestal 708 and/or showerhead 706 may be varied by any suitable mechanism within the scope of the present disclosure. In some embodiments, pedestal 708 may include a rotational axis for rotating an orientation of substrate 712. It will be appreciated that, in some embodiments, one or more of these example adjustments may be performed programmatically by one or more suitable computer controllers 750.

In some embodiments where plasma may be used as discussed above, showerhead 706 and pedestal 708 electrically communicate with a radio frequency (RF) power supply 714 and matching network 716 for powering a plasma. For example, plasma may be used to remove organic moieties from the substrate surface after depositing silicon nitride. In some embodiments, the plasma energy may be controlled by controlling one or more of a process station pressure, a gas concentration, an RF source power, an RF source frequency, and a plasma power pulse timing. For example, RF power supply 714 and matching network 716 may be operated at any suitable power to form a plasma having a desired composition of radical species. Examples of suitable powers are about 150 W to about 6000 W. For removing the organic groups from a blocked silicon surface, the substrate may be exposed to argon, or helium gas, or a mixture of argon and helium gas while igniting a plasma using the RF power supply 714 and matching network 716 to remove by sputtering using high plasma powers such as between about 500 W and about 2000 W per surface area of a 300 mm wafer. In various embodiments, such high plasma powers may be sufficient to both heat the substrate and remove the organic groups from a blocked silicon surface.

In some embodiments, for removing the organic groups from a blocked silicon oxide surface, the substrate may be exposed to argon and/or helium gas while igniting a plasma to remove by sputtering using high plasma powers such as between about 500 W and about 2000 W per surface area of a 300 mm wafer. In some embodiments, for removing the organic groups from a blocked silicon oxide surface, the substrate may be exposed to argon and/or helium gas while a plasma is ignited, or may be exposed to fluorine-containing gas, oxygen gas, or a mixture of fluorine-containing and oxygen gas while igniting a plasma. The plasma may be generated remotely (such as in a remote plasma generator) or directly in a chamber housing the substrate (i.e. in situ). In various embodiments where organic groups are removed from a blocked silicon oxide surface using a mixture of fluorine-containing and oxygen gas, a high oxygen gas to fluorine-containing gas flow rate ratio is used, such as about 50:1 of $O_2$ to $NF_3$. For example, in some embodiments, about 5000 sccm of oxygen may be flowed with about 100 sccm of $NF_3$. The power of the plasma ignited using RF power supply 714 while flowing the fluorine-containing gas, oxygen gas, or mixture of fluorine-containing and oxygen gas may be between about 75 W and about 200 W per surface area of a 300 mm wafer. The plasma power is selected to be low to prevent sputtering of material on the surface of the substrate. RF power supply 714 may provide RF power of any suitable frequency. In some embodiments, RF power supply 714 may be configured to control high- and low-frequency RF power sources independently of one another. Example low-frequency RF frequencies may include, but are not limited to, frequencies between 0 kHz and 500 kHz. Example high-frequency RF frequencies may include, but are not limited to, frequencies between 1.8 MHz and 2.45 GHz, or greater than about 13.56 MHz, or greater than 27 MHz, or greater than 40 MHz, or greater than 60 MHz. It will be appreciated that any suitable parameters may be modulated discretely or continuously to provide plasma energy for the surface reactions.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, instructions for a controller 750 may be provided via input/output control (IOC) sequencing instructions. In one example, the instructions for setting conditions for a process phase may be included in a corresponding recipe phase of a process recipe. In some cases, process recipe phases may be sequentially arranged, so that all instructions for a process phase are executed concurrently with that process phase. In some embodiments, instructions for setting one or more reactor parameters may be included in a recipe phase. For example, a first recipe phase may include instructions for setting a flow rate of a blocking reagent gas such as an alkene (e.g., 1-octadecene) or an alkylsilylhalide (e.g., octadecyltrichlorosilane), instructions for setting a flow rate of a carrier gas (such as argon), and time delay instructions for the first recipe phase. A second recipe phase may include instructions for setting a flow rate of an inert and/or silicon-containing precursor gas, instructions for setting a flow rate of a carrier gas (such as argon), and time delay instructions for a second recipe phase. A third, subsequent recipe phase may include instructions for modulating or stopping a flow rate of an inert and/or a reactant gas, and instructions for modulating a flow rate of a carrier or purge gas and time delay instructions for the third recipe phase. A fourth recipe phase may include instructions for modulating a flow rate of a nitrogen-containing gas, instructions for modulating the flow rate of a carrier or purge gas, and time delay instructions for the fourth recipe phase. A fifth, subsequent recipe phase may include instructions for modulating or stopping a flow rate of an inert and/or a reactant gas, and instructions for modulating a flow rate of a carrier or purge gas and time delay instructions for the fifth recipe phase. It will be appreciated that these recipe phases may be further subdivided and/or iterated in any suitable way within the scope of the disclosed embodiments. In some embodiments, the controller 750 may include any of the features described below with respect to system controller 850 of FIG. 8.

As described above, one or more process stations may be included in a multi-station processing tool. FIG. 8 shows a schematic view of an embodiment of a multi-station processing tool 800 with an inbound load lock 802 and an outbound load lock 804, either or both of which may include a remote plasma source. A robot 806 at atmospheric pressure is configured to move wafers from a cassette loaded through a pod 808 into inbound load lock 802 via an atmospheric port 810. A wafer is placed by the robot 806 on a pedestal 812 in the inbound load lock 802, the atmospheric port 810 is closed, and the load lock is pumped down. Where the inbound load lock 802 includes a remote plasma source, the wafer may be exposed to an optional mild etchant of HF in $H_2O$ or may be exposed to ambient in the load lock prior to being introduced into a processing chamber 814. Further, the wafer also may be heated in the inbound load lock 802 as well, for example, to remove moisture and adsorbed gases. Next, a chamber transport port 816 to processing chamber 814 is opened, and another robot (not shown) places the wafer into the reactor on a pedestal of a first station shown in the reactor for processing. While the embodiment depicted in FIG. 8 includes load locks, it will be appreciated that, in some embodiments, direct entry of a wafer into a process station may be provided.

The depicted processing chamber 814 includes four process stations, numbered from 1 to 4 in the embodiment shown in FIG. 8. Each station has a heated pedestal (shown at 818 for station 1), and gas line inlets. It will be appreciated that in some embodiments, each process station may have different or multiple purposes. For example, in some embodiments, a process station may be switchable between an ALD and plasma-enhanced ALD process mode. Additionally or alternatively, in some embodiments, processing chamber 814 may include one or more matched pairs of ALD and plasma-enhanced ALD process stations. While the depicted processing chamber 814 includes four stations, it will be understood that a processing chamber according to the present disclosure may have any suitable number of stations. For example, in some embodiments, a processing chamber may have five or more stations, while in other embodiments a processing chamber may have three or fewer stations.

FIG. 8 depicts an embodiment of a wafer handling system 890 for transferring wafers within processing chamber 814. In some embodiments, wafer handling system 890 may transfer wafers between various process stations and/or between a process station and a load lock. It will be appreciated that any suitable wafer handling system may be employed. Non-limiting examples include wafer carousels and wafer handling robots. FIG. 8 also depicts an embodiment of a system controller 850 employed to control process conditions and hardware states of process tool 800. System controller 850 may include one or more memory devices 856, one or more mass storage devices 854, and one or more processors 852. Processor 852 may include a CPU or computer, analog, and/or digital input/output connections, stepper motor controller boards, etc.

In some embodiments, system controller 850 controls all of the activities of process tool 800. System controller 850 executes system control software 858 stored in mass storage device 854, loaded into memory device 856, and executed on processor 852. Alternatively, the control logic may be hard coded in the controller 850. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 858 may include instructions for controlling the timing, mixture of gases, gas flow rates, chamber and/or station pressure, chamber and/or station temperature, wafer temperature, target power levels, RF power levels, substrate pedestal, chuck and/or susceptor position, and other parameters of a particular process performed by process tool 800. System control software 858 may be configured in any suitable way. For example, various process tool component subroutines or control objects may be written to control operation of the process tool components used to carry out various process tool processes. System control software 858 may be coded in any suitable computer readable programming language.

In some embodiments, system control software 858 may include input/output control (IOC) sequencing instructions for controlling the various parameters described above. Other computer software and/or programs stored on mass storage device 854 and/or memory device 856 associated with system controller 850 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 818 and to control the spacing between the substrate and other parts of process tool 800.

A process gas control program may include code for controlling gas composition (e.g., alkene gases, alkylsilylhalide gases, silicon-containing precursor gases, nitrogen-containing gases, carrier gases, inert gases, and/or purge gases as described herein) and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively, the heater control program may control delivery of a heat transfer gas (such as helium) to the substrate.

A plasma control program may include code for setting RF power levels applied to the process electrodes in one or more process stations in accordance with the embodiments herein.

A pressure control program may include code for maintaining the pressure in the reaction chamber in accordance with the embodiments herein.

In some embodiments, there may be a user interface associated with system controller 850. The user interface may include a display screen, graphical software displays of the apparatus and/or process conditions, and user input devices such as pointing devices, keyboards, touch screens, microphones, etc.

In some embodiments, parameters adjusted by system controller 850 may relate to process conditions. Non-limiting examples include process gas composition and flow rates, temperature, pressure, plasma conditions (such as RF bias power levels), etc. These parameters may be provided to the user in the form of a recipe, which may be entered utilizing the user interface.

Signals for monitoring the process may be provided by analog and/or digital input connections of system controller 850 from various process tool sensors. The signals for controlling the process may be output on the analog and digital output connections of process tool 800. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 850 may provide program instructions for implementing the above-described deposition processes. The program instructions may control a variety of process parameters, such as DC power level, RF bias power level, pressure, temperature, etc. The instructions may control the parameters to operate in-situ deposition of film stacks according to various embodiments described herein.

The system controller 850 will typically include one or more memory devices and one or more processors configured to execute the instructions so that the apparatus will perform a method in accordance with disclosed embodiments. Machine-readable media containing instructions for controlling process operations in accordance with disclosed embodiments may be coupled to the system controller 850.

In some implementations, the system controller 850 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The system controller 850, depending on the processing conditions and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 850 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the system controller 850 in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The system controller 850, in some implementations, may be a part of or coupled to a computer that is integrated with, coupled to the system, otherwise networked to the system, or a combination thereof. For example, the system controller 850 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 850 receives instructions in the form of data, which specify parameters for each of the processing steps to be performed during one or more operations. It should be understood that the parameters may be specific to the type of process to be performed and the type of tool that the system controller 850 is configured to interface with or control. Thus as described above, the system controller 850 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the system controller 850 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

An appropriate apparatus for performing the methods disclosed herein is further discussed and described in U.S. patent application Ser. No. 13/084,399 (now U.S. Pat. No. 8,728,956), filed Apr. 11, 2011, and titled "PLASMA ACTIVATED CONFORMAL FILM DEPOSITION"; and Ser. No. 13/084,305, filed Apr. 11, 2011, and titled "SILICON NITRIDE FILMS AND METHODS," each of which is incorporated herein in its entireties.

The apparatus/process described herein may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

Conclusion

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method of depositing silicon nitride on a semiconductor substrate, the method comprising:
    providing the semiconductor substrate having a blocked surface and an unblocked surface, the blocked surface comprising an organic moiety having an Si—C bond; and
    selectively depositing silicon nitride on the unblocked surface by one or more thermal atomic layer deposition cycles, each cycle comprising:
        exposing the semiconductor substrate having the blocked and unblocked surfaces to a silicon-containing precursor to adsorb the silicon-containing precursor to the unblocked surface; and
        exposing the semiconductor substrate to a nitrogen-containing reactant without igniting a plasma to form silicon nitride selectively on the unblocked surface relative to the blocked surface.

2. The method of claim 1, wherein the unblocked surface is a non-silicon surface.

3. The method of claim 1, wherein the unblocked surface is a non-silicon-oxide surface.

4. The method of claim 1, wherein the unblocked surface comprises hydroxyl groups.

5. The method of claim 1, further comprising preparing the blocked surface by exposing the semiconductor substrate to an alkene.

6. The method of claim 5, wherein the alkene is 1-octadecene.

7. The method of claim 1, further comprising preparing the blocked surface by exposing the semiconductor substrate to an alkylsilylhalide having a chemical structure

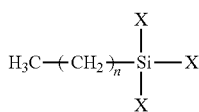

wherein X is a halogen, and n is an integer between and including 1 and 20.

8. The method of claim 7, wherein the alkylsilylhalide is octadecyltrichlorosilane.

9. The method of claim 7, further comprising, after selectively depositing the silicon nitride, removing the organic moiety by exposing the semiconductor substrate to a mixture of a fluorine-containing gas and an oxygen-containing gas and igniting a plasma at a plasma power between about 75 W and about 200 W.

10. The method of claim 9, wherein the plasma is ignited in a remote plasma generator.

11. The method of claim 9, wherein the plasma is ignited in situ.

12. The method of claim 1, further comprising, after selectively depositing the silicon nitride, removing the organic moiety.

13. The method of claim 12, wherein removing the organic moiety comprises exposing the semiconductor substrate to an inert gas selected from the group consisting of helium and argon and igniting a plasma at a plasma power between about 500 W and about 2000 W.

14. A method of depositing silicon nitride on a semiconductor substrate, the method comprising:
providing the semiconductor substrate having an exposed hydroxyl-terminated silicon-containing surface and an exposed hydrogen-terminated silicon-containing surface;
exposing the semiconductor substrate to a blocking reagent to block one of the exposed hydroxyl-terminated silicon-containing surface and the exposed hydrogen-terminated silicon-containing surface by forming an organic moiety on the one of the exposed hydroxyl-terminated silicon-containing surface and the exposed hydrogen-terminated silicon-containing surface while the other of the exposed hydroxyl-terminated silicon-containing surface and the exposed hydrogen-terminated silicon-containing surface remains unblocked; and
selectively depositing silicon nitride on the other of the exposed hydroxyl-terminated silicon-containing surface and the exposed hydrogen-terminated silicon-containing surface by one or more thermal atomic layer deposition cycles, each cycle comprising:
exposing the semiconductor substrate having the blocked and unblocked surfaces to a silicon-containing precursor to adsorb the silicon-containing precursor to the unblocked surface; and
exposing the semiconductor substrate to a nitrogen-containing reactant without igniting a plasma to form silicon nitride selectively on the unblocked surface relative to the blocked surface.

15. The method of claim 14, further comprising, prior to exposing the semiconductor substrate to the blocking reagent, exposing the semiconductor substrate to hydrogen to form the exposed hydrogen-terminated silicon-containing surface.

16. The method of claim 14, further comprising, prior to exposing the semiconductor substrate to the blocking reagent, exposing the semiconductor substrate to ambient air to form the exposed hydroxyl-terminated silicon-containing surface.

17. The method of claim 14, further comprising, prior to exposing the semiconductor substrate to the blocking reagent, exposing the semiconductor substrate to 1% hydrofluoric acid diluted in water to form the exposed hydroxyl-terminated silicon-containing surface.

18. The method of claim 14, wherein the blocking reagent is an alkene.

19. The method of claim 14, wherein the blocking reagent is an alkylsilylhalide having a chemical structure

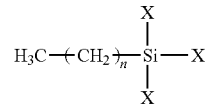

wherein X is a halogen, and n is an integer between and including 1 and 20.

* * * * *